United States Patent
Kobayashi

(10) Patent No.: US 6,933,787 B1
(45) Date of Patent: Aug. 23, 2005

(54) LINEARIZED DARLINGTON AMPLIFIER

(75) Inventor: Kevin W. Kobayashi, Torrance, CA (US)

(73) Assignee: Sirenza Microdevices, Inc., Broomfield, CO (US)

( * ) Notice: Subject to any disclaimer, the term of this patent is extended or adjusted under 35 U.S.C. 154(b) by 0 days.

(21) Appl. No.: 10/742,098

(22) Filed: Dec. 19, 2003

(51) Int. Cl.[7] .................................................. H03F 3/04
(52) U.S. Cl. ........................ 330/311; 330/250; 330/296
(58) Field of Search ........................ 330/311, 250, 296, 330/98, 99, 100, 310

(56) References Cited

U.S. PATENT DOCUMENTS

| | | | | | |
|---|---|---|---|---|---|
| 3,832,645 | A | * | 8/1974 | Greutman | 330/283 |
| 4,345,217 | A | * | 8/1982 | Pace | 330/288 |
| 4,697,155 | A | * | 9/1987 | Lehning | 330/297 |
| 4,706,038 | A | * | 11/1987 | Navidi et al. | 330/271 |

* cited by examiner

*Primary Examiner*—Patricia Nguyen
(74) *Attorney, Agent, or Firm*—Christopher P. Maiorana, PC

(57) ABSTRACT

An apparatus comprising a Darlington transistor pair and a common-base transistor. The Darlington transistor pair may be configured to generate an output signal in response to an input signal. The common-base transistor may (i) be coupled between an output transistor of the Darlington transistor pair and the output signal and (ii) have a base configured to receive a frequency dependent reference voltage.

20 Claims, 12 Drawing Sheets

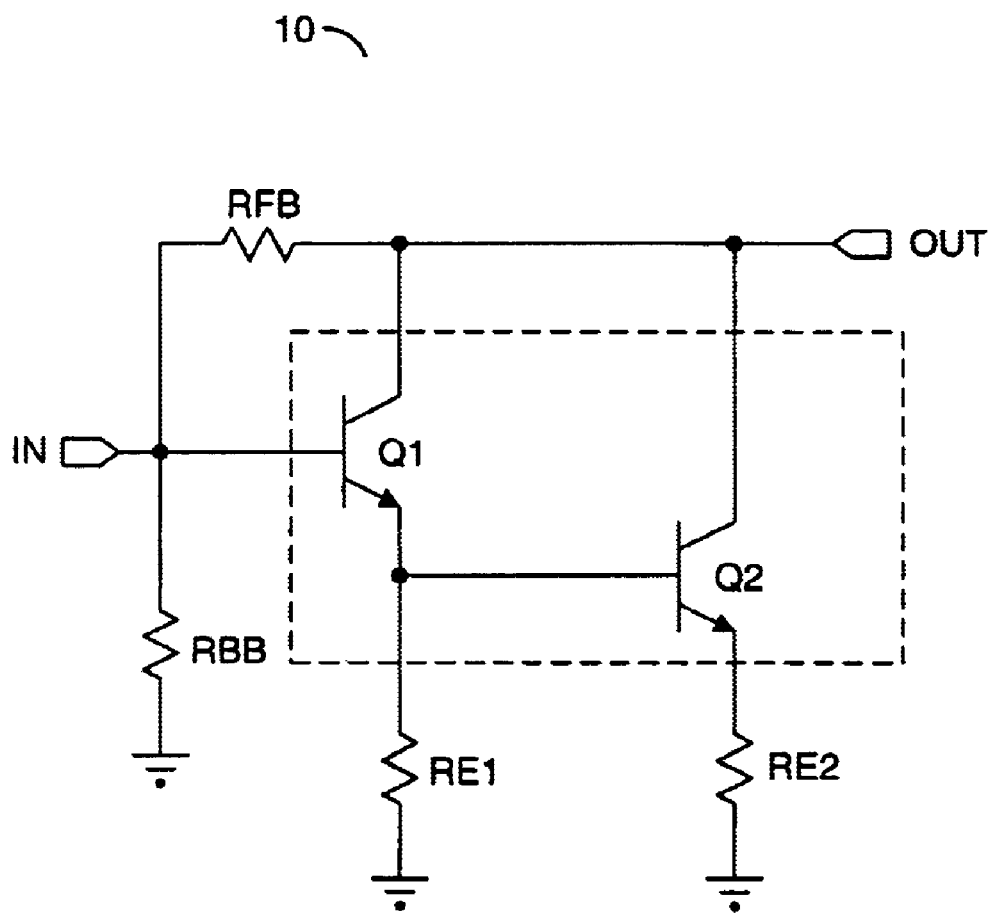
(CONVENTIONAL)
FIG. 1

US 6,933,787 B1

LINEARIZED DARLINGTON AMPLIFIER

FIELD OF THE INVENTION

The present invention relates to amplifiers generally and, more particularly to a method and/or circuit for implementing a linearized darlington amplifier.

BACKGROUND OF THE INVENTION

Darlington amplifiers are noted for having a wide band gain response, a compact size, and a low cost package implementation. Darlington amplifiers typically have superior gain-bandwidth performance compared to common-emitter feedback amplifiers and/or are popular RF gain block products.

While Darlington amplifiers have advantages over the common-emitter transistor in conventional feedback amplifiers, the broadband linearity performance of a Darlington still suffers due to the open loop insertion phase departure from 180 degrees as frequency increases. As a result, the IP3 (or third order intercept point) of the Darlington feedback amplifier, a measure of amplifier linearity, uniformly degrades with increasing frequency.

Referring to FIG. 1, a circuit 10 illustrating a conventional Darlington feedback amplifier topology is shown. The circuit 10 comprises a Darlington transistor pair 12 (implemented with a transistor Q1 and a transistor Q2), a series feedback resistor RE2, a parallel feedback resistor RFB, and bias resistors RE1 and RBB.

The Darlington pair (or cell) 12 is known to have advantages over the common-emitter transistor in feedback amplifiers applications. For instance, the Darlington amplifier 10 can provide higher current gain and cut-off frequency, and can be designed to have a higher input impedance, which is preferred in feedback implementations.

It would be desirable to implement a circuit and/or method to compensate for the fundamental phase degradation of the Darlington cell. It would also be desirable to use such a circuit and/or method to improve broadband IP3 performance by optimizing the second harmonic phase response of the Darlington cell.

SUMMARY OF THE INVENTION

The present invention concerns an apparatus comprising a Darlington transistor pair and a common-base transistor. The Darlington transistor pair may be configured to generate an output signal in response to an input signal. The common-base transistor may (i) be coupled between an output transistor of the Darlington transistor pair and the output signal and (ii) have a base configured to receive a frequency dependent reference voltage.

The objects, features and advantages of the present invention include providing a linearized Darlington amplifier that may (i) compensate for phase degration, (ii) improve broadband IP3 performance when compared with conventional approaches, (iii) optimize second harmonic phase response, and/or (iv) provide an electronic tuning mechanism.

BRIEF DESCRIPTION OF THE DRAWINGS

These and other objects, features and advantages of the present invention will be apparent from the following detailed description and the appended claims and drawings in which:

FIG. 1 is a diagram of a conventional Darlington implementation;

DETAILED DESCRIPTION OF THE PREFERRED EMBODIMENTS

The present invention may implement a circuit and/or method for improving the broadband linearity (IP3) performance of a Darlington feedback amplifier. The present invention may provide a common-base transistor in cascode with an output device of the Darlington pair to provide an adjustment of the output phase of the Darlington cell. The present invention may also provide a DC voltage reference for providing (i) a DC bias to the base of the common-base transistor and (ii) a frequency dependent AC impedance to the base of the common-base transistor. The present invention may also provide a DC voltage reference that includes at least one emitter follower and an inductive element. The voltage reference may provide for tuning of the frequency dependent impedance provided to the base of the common-base transistor to compensate for the phase of the output (and the resulting broadband linearity performance of the amplifier). The present invention may also provide an electronically tunable implementation for optimizing linearity or IP3.

Figure 2:
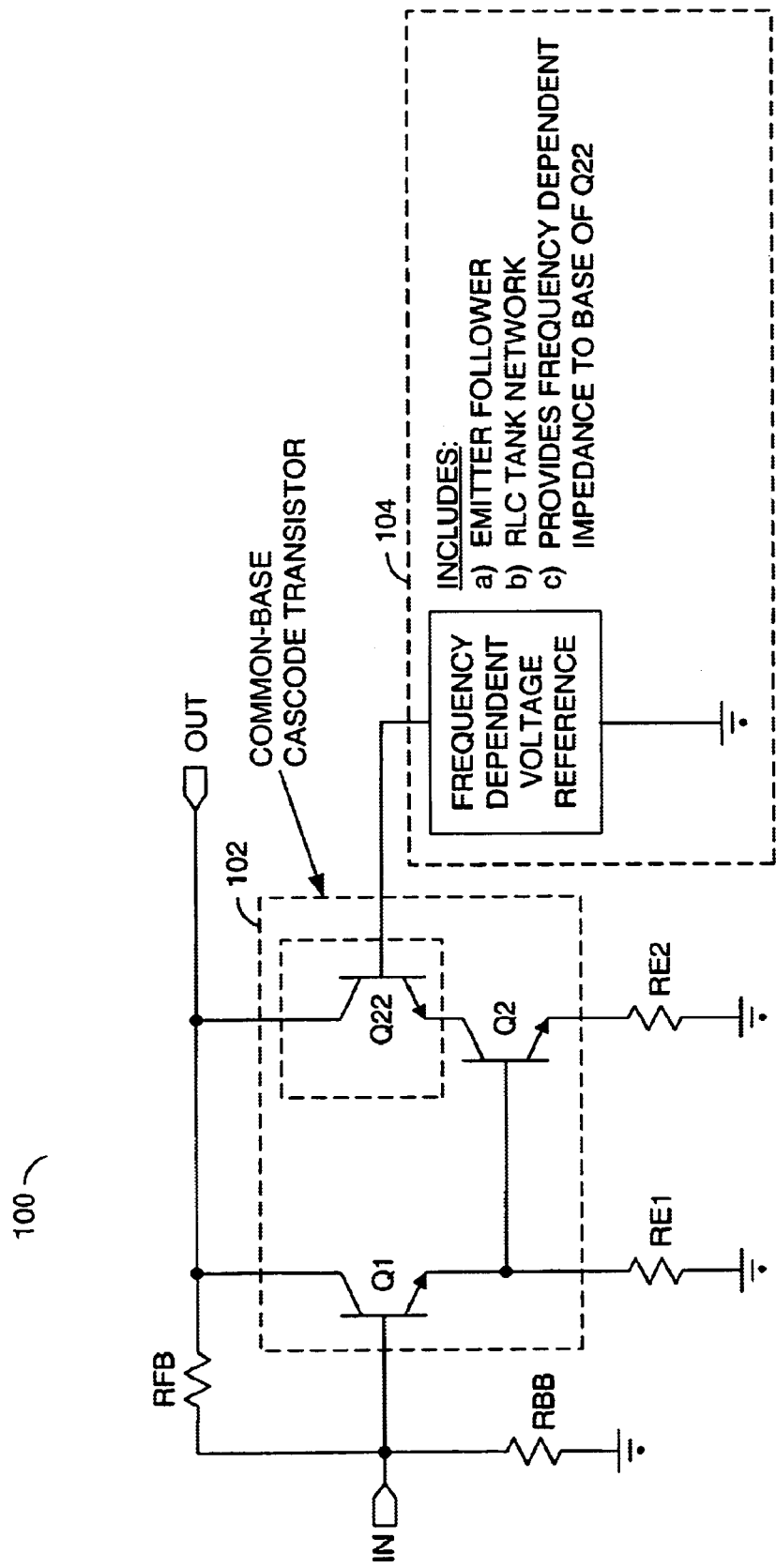
FIG. 2 is a diagram of a preferred embodiment of the present invention.

Referring to FIG. 2, a circuit 100 is shown implementing a preferred embodiment of the present invention. The circuit 100 generally comprises an amplifier section 102, a reference voltage generation circuit 104, and a number of resistors (e.g., RFB, RBB, RE1, and RE2). The amplifier section 102 generally comprises a transistor Q1, a transistor Q2, and a transistor Q22. The resistor RFB may be implemented as a parallel feedback resistor. The resistor REE2 may be implemented as a series feedback resistor. The resistors REE1 and RBB may be implemented as bias resistors.

The transistor Q22 may be implemented as a common base transistor. The transistor Q22 generally acts to (i) increase the breakdown voltage and bandwidth of the Darlington amplifier (see Ser. No. 10/368,530, which is hereby incorporated by reference in its entirety) and (ii) compensate for the open-loop insertion phase of the Darlington (which is dependent on the impedance characteristic of the voltage reference 104 attached to the base of the transistor Q22).

The circuit 100 may implement the reference circuit 104 as a frequency dependent voltage reference circuit. The reference circuit 104 (to be described in more detail in connection with FIG. 3) may include an emitter follower, and at least one inductive element. The inductive element may help to provide a desirable frequency dependent impedance to the base of the common-base transistor Q22. Further elements may be added to the inductive element to construct a RLC network for optimizing gain-bandwidth, IP3, and/or stability performance. By choosing an appropriate combination of the RLC network, the broadband impedance of the voltage reference circuit 104 may be tailored to create an optimal impedance and phase at the collector of the transistor Q22, which generally results in broadband IP3 performance.

Figure 3:
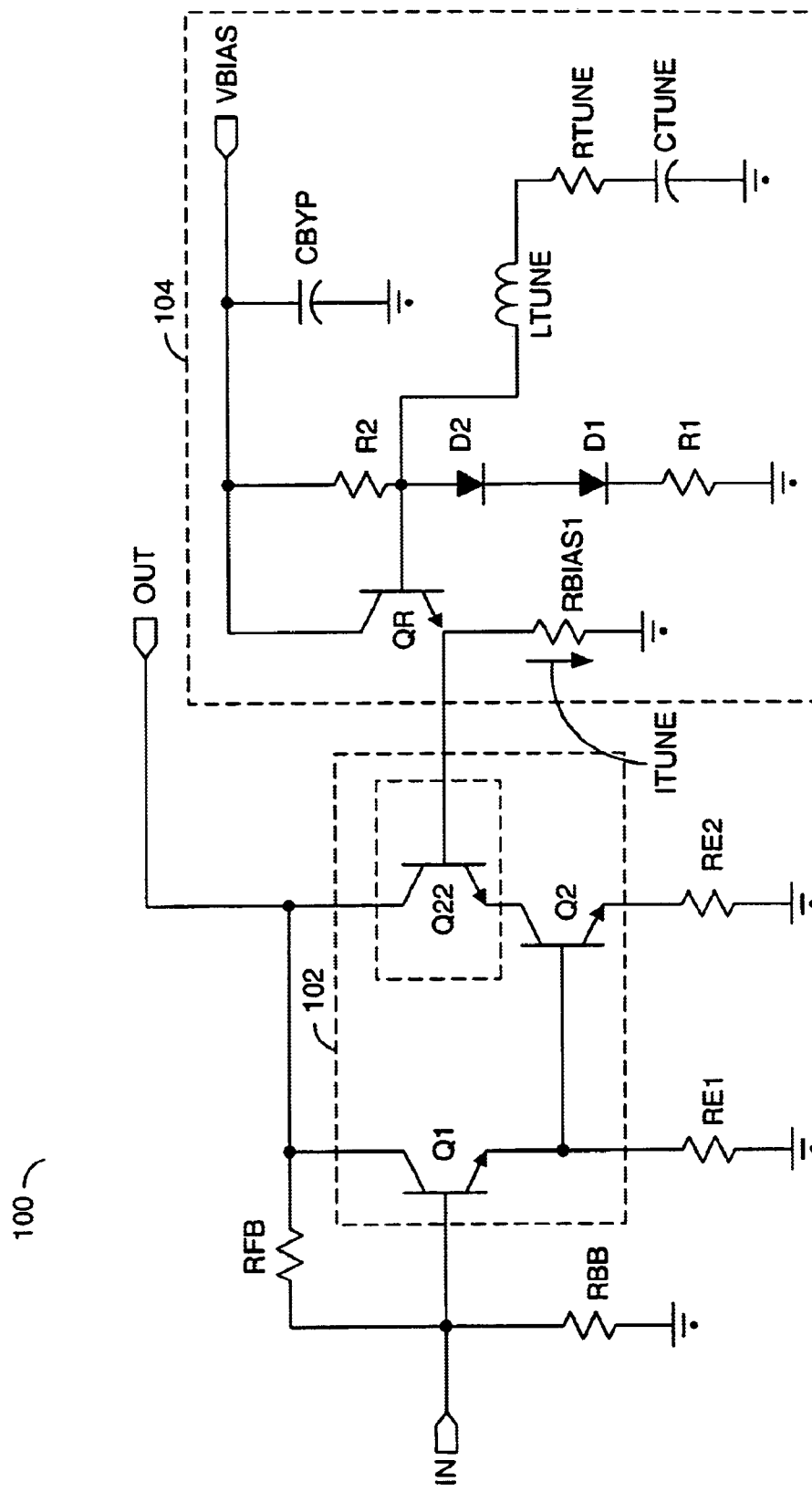
FIG. 3 is a more detailed diagram of a preferred embodiment of the present invention.

Referring to FIG. 3, a more detailed diagram of the circuit 100 is shown. The circuit 100 includes details of the frequency dependent voltage reference circuit 104. The frequency dependent voltage reference circuit 104 generally comprises a transistor (e.g., QR), an inductive element (e.g., LTUNE), a resistor (e.g., RBIAS), a resistor (e.g., R2), a capacitor (e.g., CBYP), a diode (e.g., D1), a diode (e.g., D2), a resistor (e.g., RTUNE), and a capacitor (e.g., TUNE). The transistor QR may be implemented as an emitter follower transistor.

The frequency dependent voltage reference 104 normally relies on the active impedance transformation of the LRC tank circuit (e.g., the inductor LTUNE, the resistor RTUNE, and the capacitor CTUNE). The impedance is actively transformed by the common-collector transistor QR. The collector of the transistor QR is shown AC coupled to ground through the capacitor CBYP. The transistor QR has a base that may be biased using a temperature dependent voltage divider reference comprising the resistors R2 and R1, and the diodes D1 and D2. While one implementation of the reference 104 is shown, other implementations may be used to meet the design criteria of a particular implementation. For example, the reference 104 may be replaced by a bandgap reference or other temperature dependent voltage reference topology. The bias resistor RBIAS1 is generally attached to the emitter of the transistor QR in order to set the bias current ITUNE.

The active impedance provided to the base of the transistor QR is strongly dependent on the area and bias of the transistor QR and the series inductive element LTUNE. The impedance is also dependent on the values of the resistor RTUNE and the capacitor CTUNE as shown in FIG. 3. The resistor RTUNE generally de-Q's (or damps) the LRC tank circuit to provide stability. The capacitor CTUNE may be thought of an AC short at high frequencies, but may also be tuned. The inductor LTUNE may be implemented as a series of inductive elements, such as microstrip transmission lines, each having a length that may be adjusted for optimal broadband amplifier IP3 performance. Electronic tuning the IP3 (via the impedance provided to the base of the transistor QR) is normally achieved by adjusting the resistor RBIAS1 for various currents, or by employing an adjustable current source in place of the resistor RBIAS1.

Figure 4:
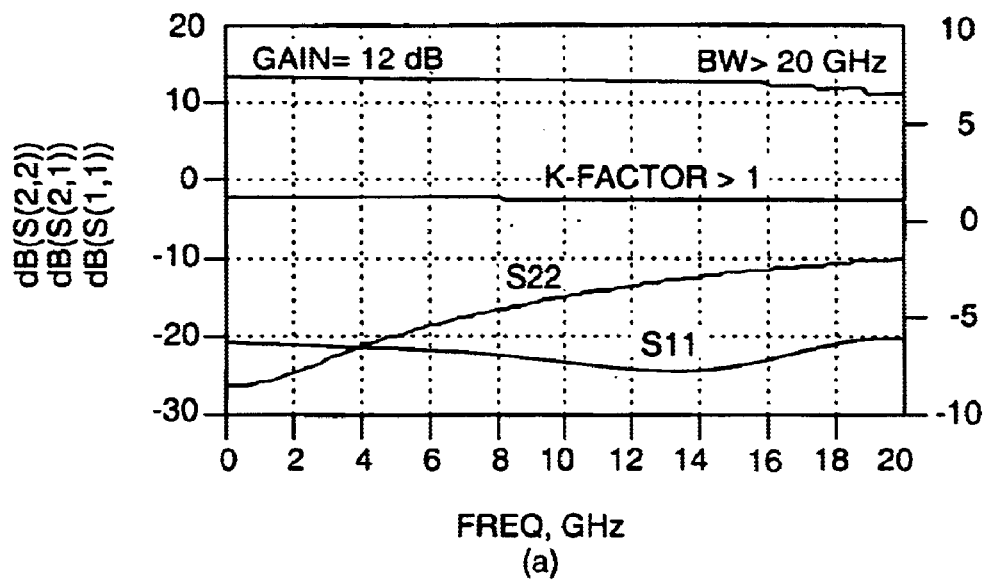
FIG. 4 is a diagram comparing small-signal performance of one embodiment of the present invention with a conventional approach.
Figure 4:
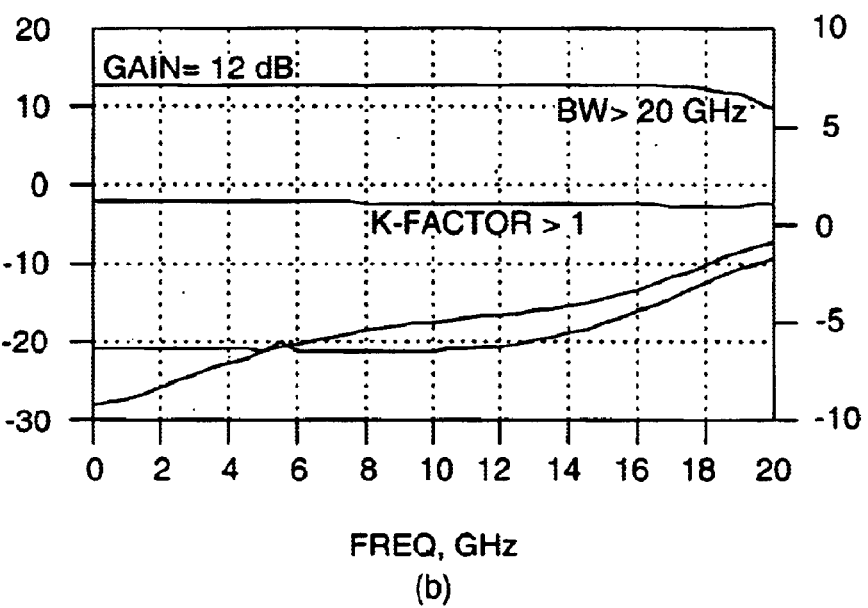

Referring to FIG. 4, a diagram illustrating small signal performance is shown. FIG. 4(a) illustrates the performance of a conventional Darlington. FIG. 4(b) illustrates the performance of the linearized Darlington amplifier 100 of the present invention. In one example, the present invention may be implemented in InP HBT technology and may be nominally optimized for broadband IP3 performance. The linearized Darlington amplifier 100 does not compromise significant gain, bandwidth or return-loss for the optimized combination of ITUNE=2.5 mA, RTUNE=15 ohms, C=5 pF, and LTUNE=4×400 um2 (a transmission line on 100 um InP).

Figure 5:
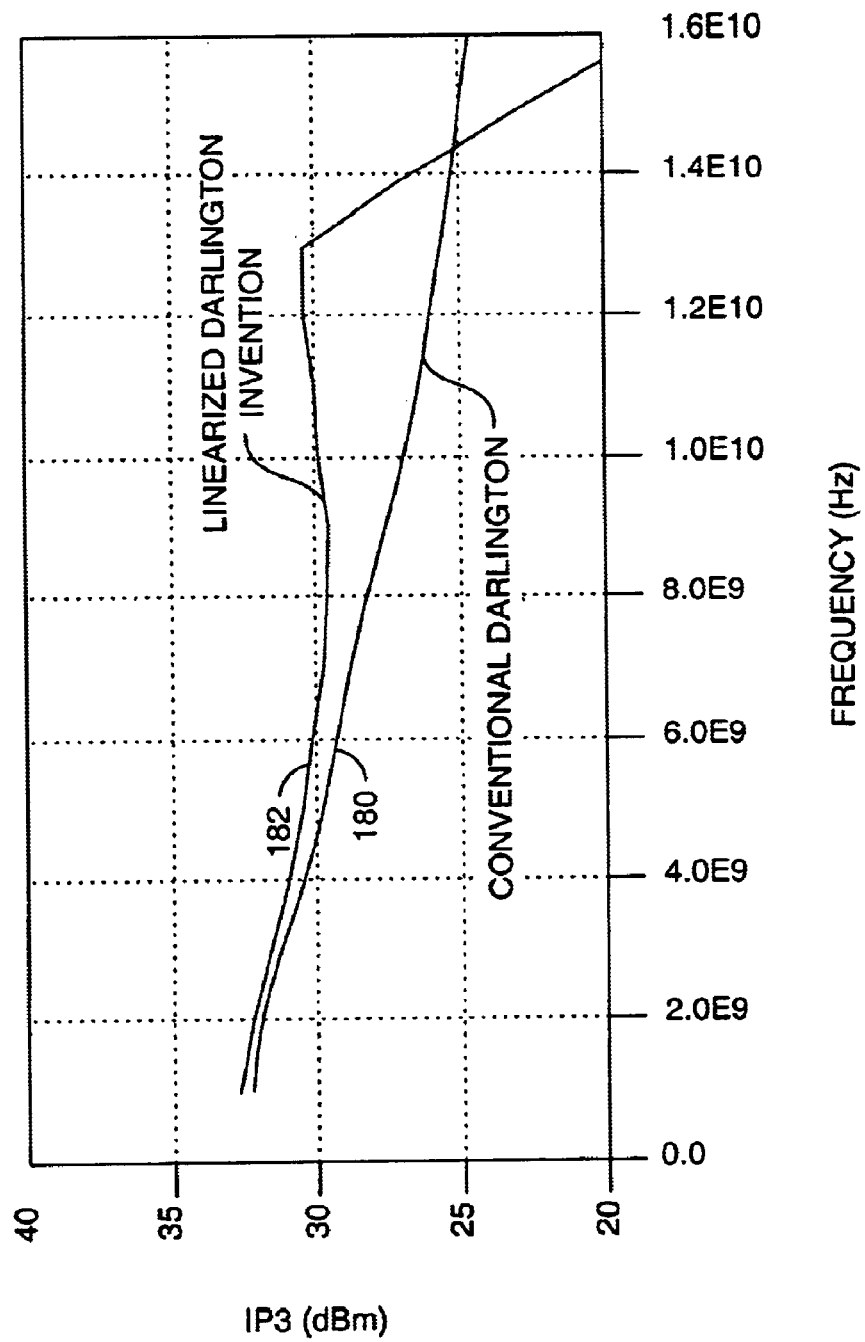
FIG. 5 is a diagram comparing the IP3 performance of one embodiment of the present invention with a conventional implementation.

Referring to FIG. 5, a diagram illustrating the IP3 between (i) a conventional Darlington (trace 180) and (ii) the linearized Darlington amplifier 100 of the present invention (trace 182) is shown. FIG. 5 compares the IP3 improvement gained by the linearized Darlington feedback amplifier 100 of the present invention. The amplifier 100 may achieve nearly 30 dBm (or greater) across a 13 GHz bandwidth compared with 6 GHz for the conventional case (a factor of 2 improvement in IP3-bandwidth product). A 4 dB improvement is shown at the upper band edge at 13 GHz while consuming only a few mA of additional current (e.g., a<5% increase in total current).

Figure 6:
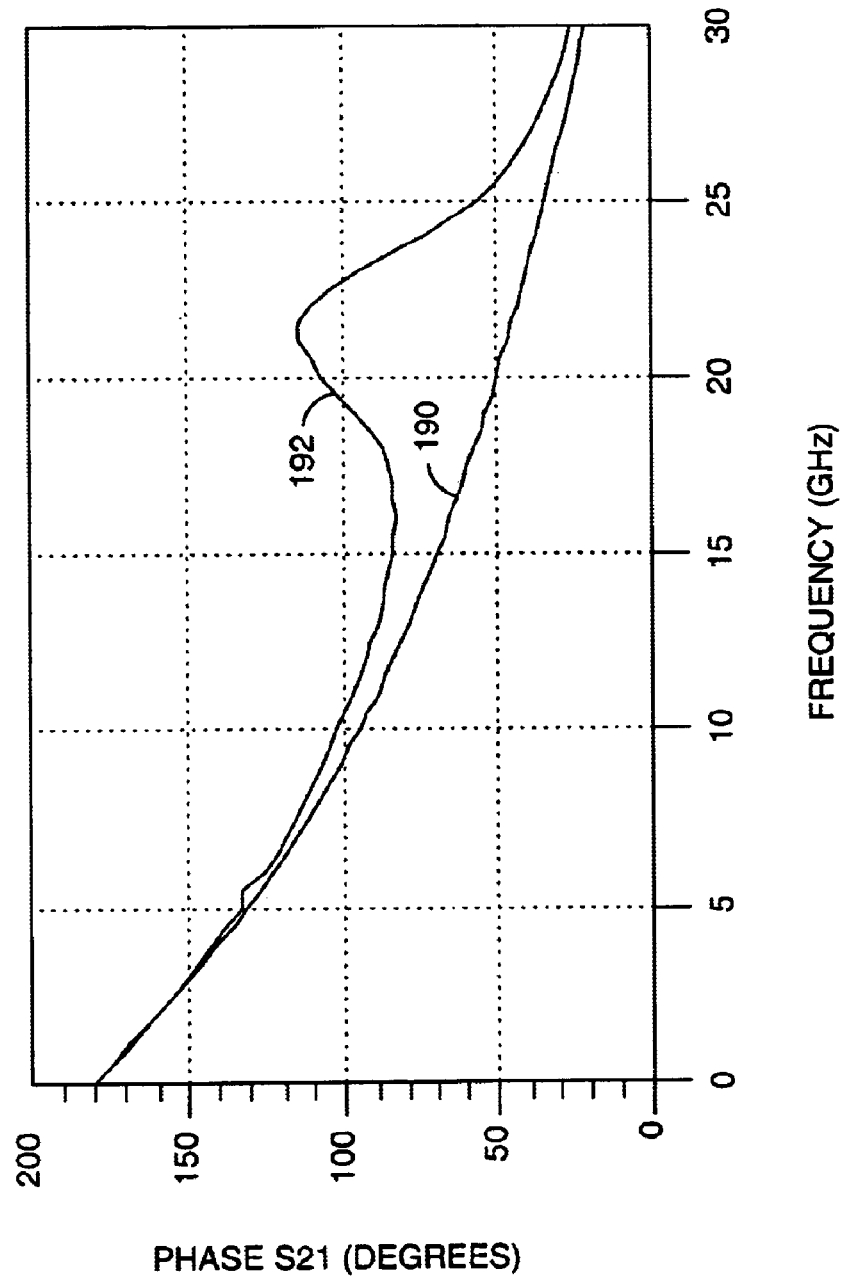
FIG. 6 is a diagram comparing the open loop phase of one embodiment of the present invention with a conventional implementation.

Referring to FIG. 6, an open loop phase comparison is shown. A simulated open loop insertion phase is shown comparing (i) the conventional Darlington (trace 190) and (ii) the linearized Darlington amplifier 100 of the present invention (trace 192). The phase generally drops off from 180 degrees at low frequencies, and has a near linear drop off in phase with frequency for the conventional case. For the linearized Darlington amplifier 100, the LRC was simulated in order to establish optimal IP3, which results in an optimal phase open-loop phase profile shown. The enhanced high frequency IP3 is obtained due to the phase shift at the second harmonic frequency. This optimally changes the phase of the second harmonic signal which is fed back to the input from the output. A de-Q'd positive phase hump in the linearized phase response is illustrated. The phase hump allows broadband IP3 enhancement at the fundamental around 12–14 GHz.

Figure 7:
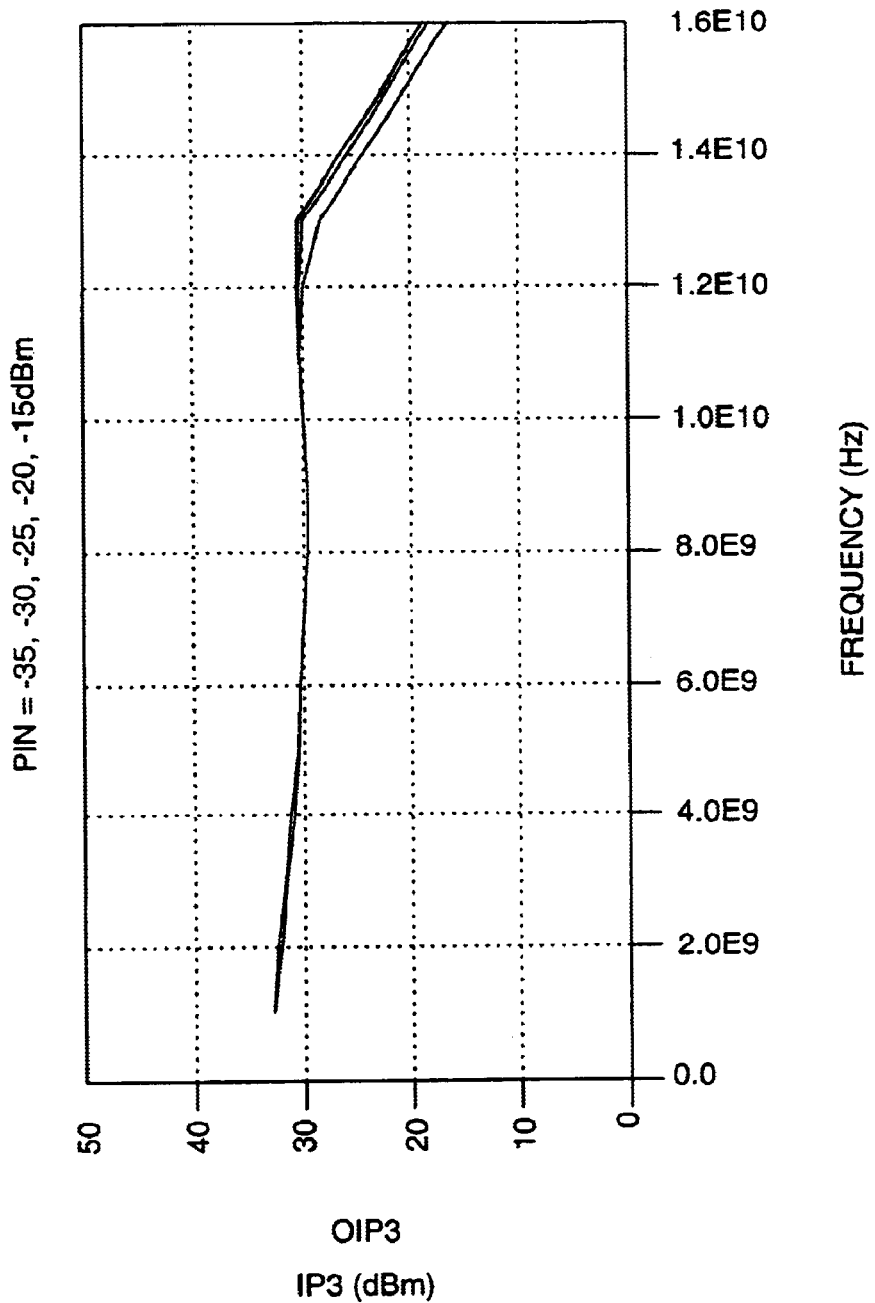
FIG. 7 is a diagram illustrating IP3 characteristics with various input signals.

Referring to FIG. 7, a diagram illustrating robustness of the linearized Darlington amplifier 100 of the present invention over a wide input power range (e.g., Pin=−35 to −15 dBm) is shown. Linearization is often the subject of much scrutiny because such linearization is typically sensitive to (a) input power range and (b) operating temperature. FIG. 7 illustrates the broadband IP3 performance of the present invention over a wide input power range from Pin=−35 dBm to −15 dBm. FIG. 7 illustrates low sensitivity to input power levels and suggests that the present invention is robust over input power range.

Figure 8:
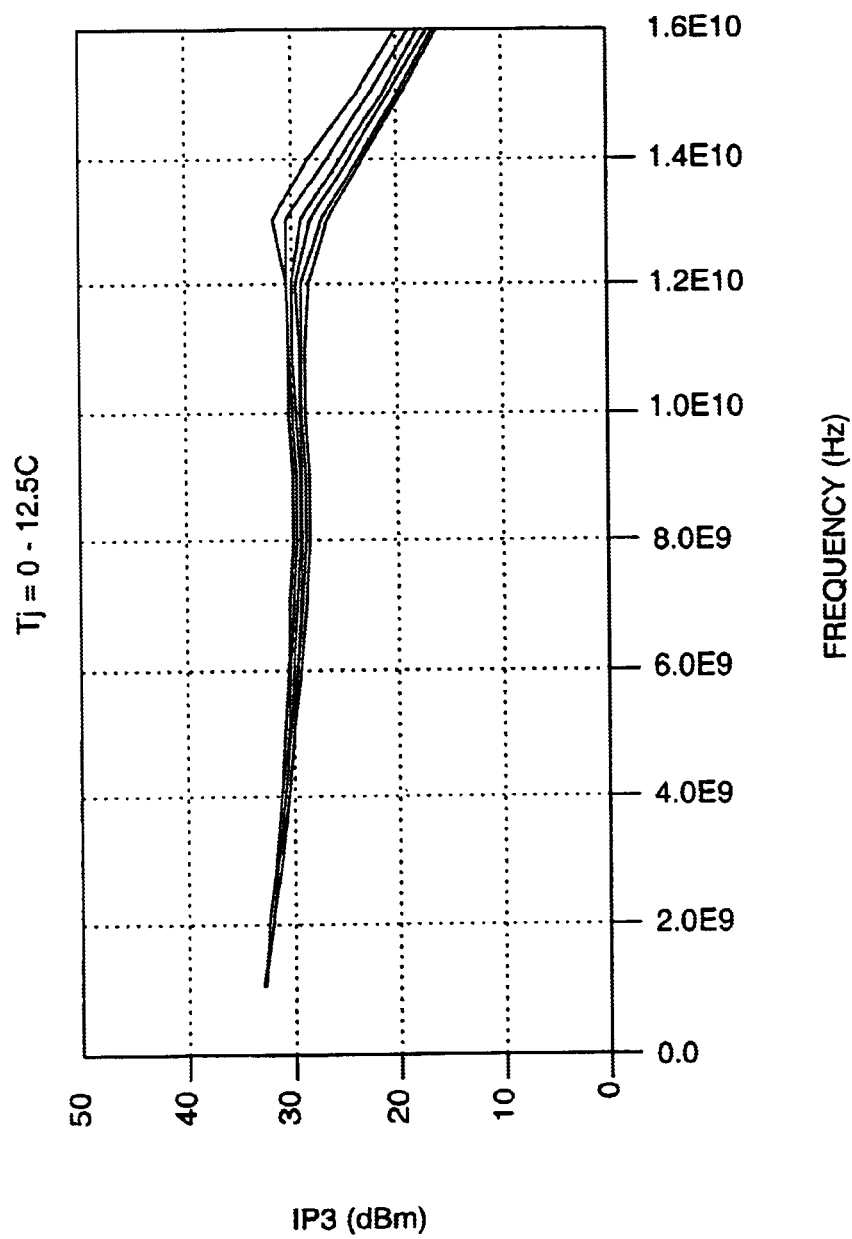
FIG. 8 is a diagram illustrating IP3 characteristics over a range of temperatures.

Referring to FIG. 8, the linearized Darlington amplifier 100 is shown illustrating robustness over temperature. FIG. 8 illustrates temperature=0 to 125 C, illustrating that the present invention is robust over a wide temperature range. The broadband IP3 is reasonable stable over a temperature range from 0 to 125 C with reasonable variation across a DC to 12 GHz band and at the upper frequency edge.

Figure 9:
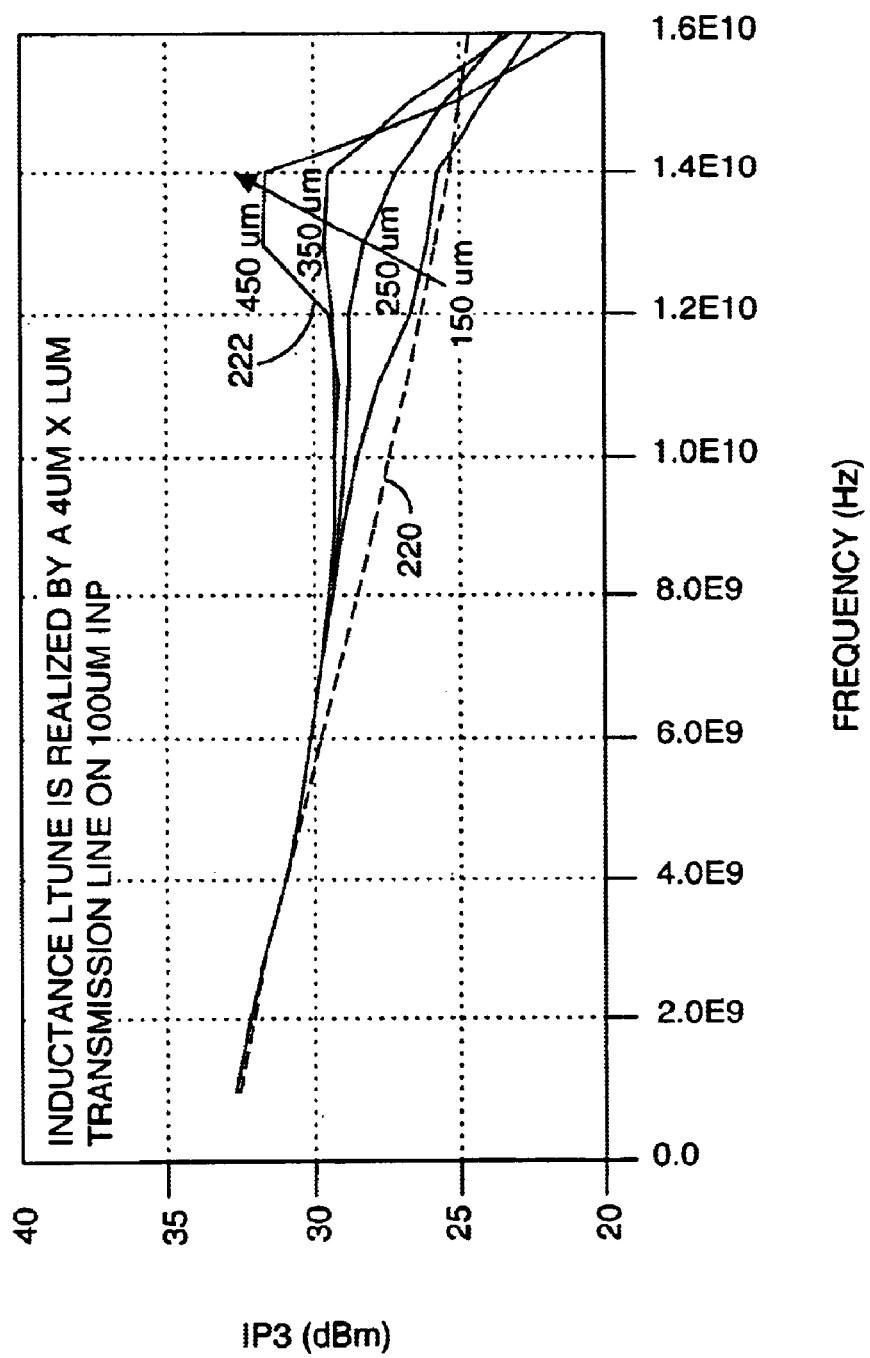
FIG. 9 is a diagram comparing the IP3 characteristics of one embodiment of the present invention with a conventional implementation where an inductive element is being adjusted for optimizing IP3.

Referring to FIG. 9, IP3 of the present invention as a result of tuning the inductive element LTUNE is shown. A plot of a conventional Darlington amplifier 220 is shown for reference. FIG. 9 shows adjustments of the inductor LTUNE, the capacitor CTUNE= 5 pF; the resistor RTUNE=15 ohms; and the current ITUNE=2.5 mA. The linearized Darlington amplifier 100 may be optimized over a broadband by tuning a combination of the inductance LTUNE, the capacitance CTUNE, the resistance RTUNE and the current ITUNE.

For a fixed capacitance CTUNE=5 pF, resistance RTUNE= 15 ohms and current ITUNE=2.5 mA, FIG. 9 illustrates the IP3 improvement that may be achieved by tuning various lengths of an inductive transmission line that effectively tunes the inductance LTUNE. For this example, the inductance LTUNE is implemented as a 4×L um2 transmission line on 100 um InP substrates. Larger lengths (e.g., L) generally result in larger inductance LTUNE. The upper band IP3 performance 220 may be significantly improved over the conventional IP3 response 220. This example shows an IP3 improvement of nearly 7 dB at 14 GHz using a 4×450 um length L transmission line. Such an improvement corresponds to 14 dBc in IM3 suppression.

Figure 10:
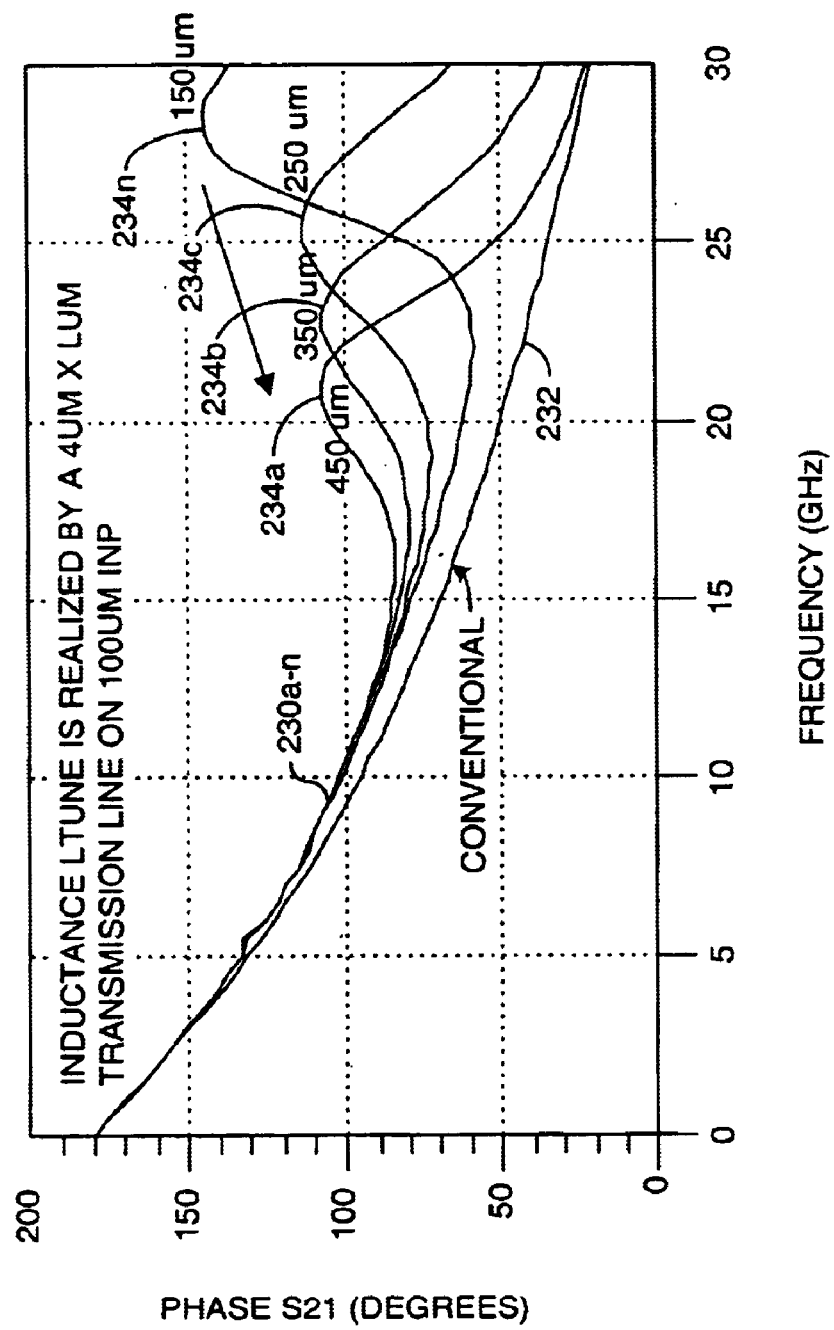
FIG. 10 is a diagram illustrating the open loop characteristics when adjusting an inductive tuning element.

Referring to FIG. 10, the open loop phase of the linearized Darlington amplifier 100 is shown by adjusting the inductance LTUNE, the capacitance CTUNE=5 pF; the resistance RTUNE= 15 ohms, and the current ITUNE=2.5 mA. The corresponding insertion phase of the tuned linearized Darlington amplifier 100 is shown as a number of traces 230*a–n*. The insertion phase of the conventional Darlington is shown as trace 232. By tuning the transmission line length L, the insertion phase compensation hump 234*a–n* may be tuned. Large transmission line lengths L generally result in a lower frequency phase compensation hump 234*a–n* by moving the hump closer to the second harmonic of the upper band edge of FIG. 9. Although not quantitative, FIG. 9 illustrates that the open loop phase profile of the linearized Darlington amplifier 100 does tune with respect to the inductance LTUNE. The optimum solution generally occurs approximately where the phase compensation hump 234*a–n* coincides with the 2×f–3 dB (upper band edge) frequency.

Figure 11:
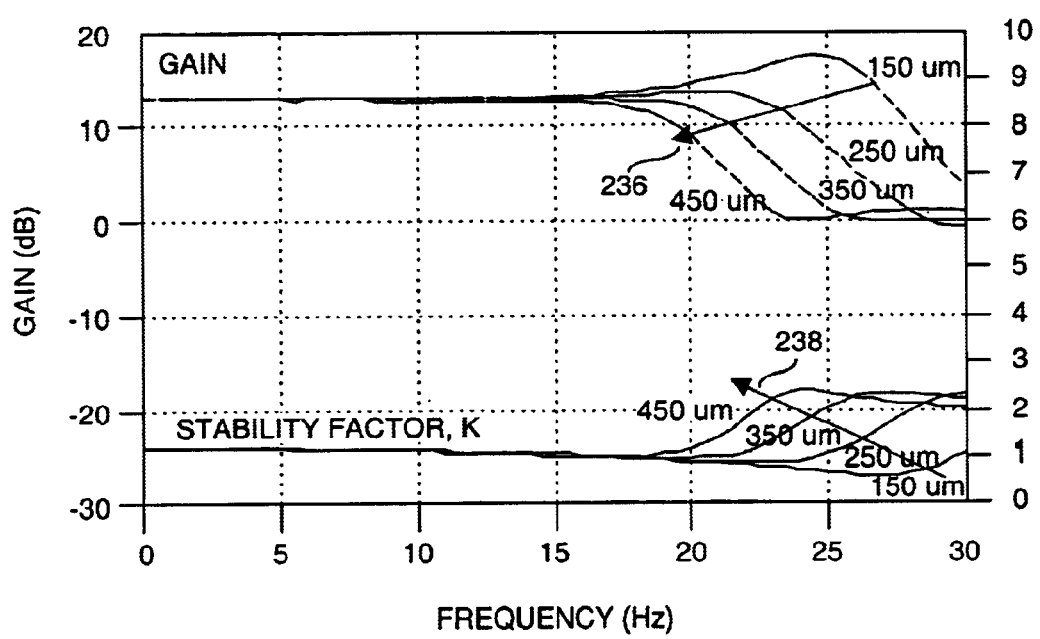
FIG. 11 is a diagram illustrating a closed loop gain and stability when adjusting the LTUNE tuning element.

Referring to FIG. 11, a closed loop gain and stability factor is shown as a result of tuning inductive element LTUNE. The linearized Darlington amplifier 100 is shown by adjusting the inductance LTUNE, the capacitance CTUNE=5 pF, the resistance RTUNE= 15 ohms, and the current ITUNE=2.5 mA. The inductance LTUNE may be implemented with a 4 um×Lum transmission line on 100 um InP. The corresponding closed loop gain and stability factor of the tuned linearized Darlington amplifier 100 is given in FIG. 11 versus microstrip transmission line length. The optimal IP3 line length of 350–450 um corresponds to a more stable K-factor>1 and gain that is lower in bandwidth, but without positive gain slope. For this example, a line length of 350–450 um appears to be optimal in terms of gain, stability and IP3. Thus optimum IP3 may be achieved while maintaining amplifier stability and controlled gain roll-off. The arrow 236 illustrates a trend of the gain peaking subsidizing as IP3 is optimized. The arrow 238 shows a trend of the K-factor improving as IP3 is optimized.

Figure 12:
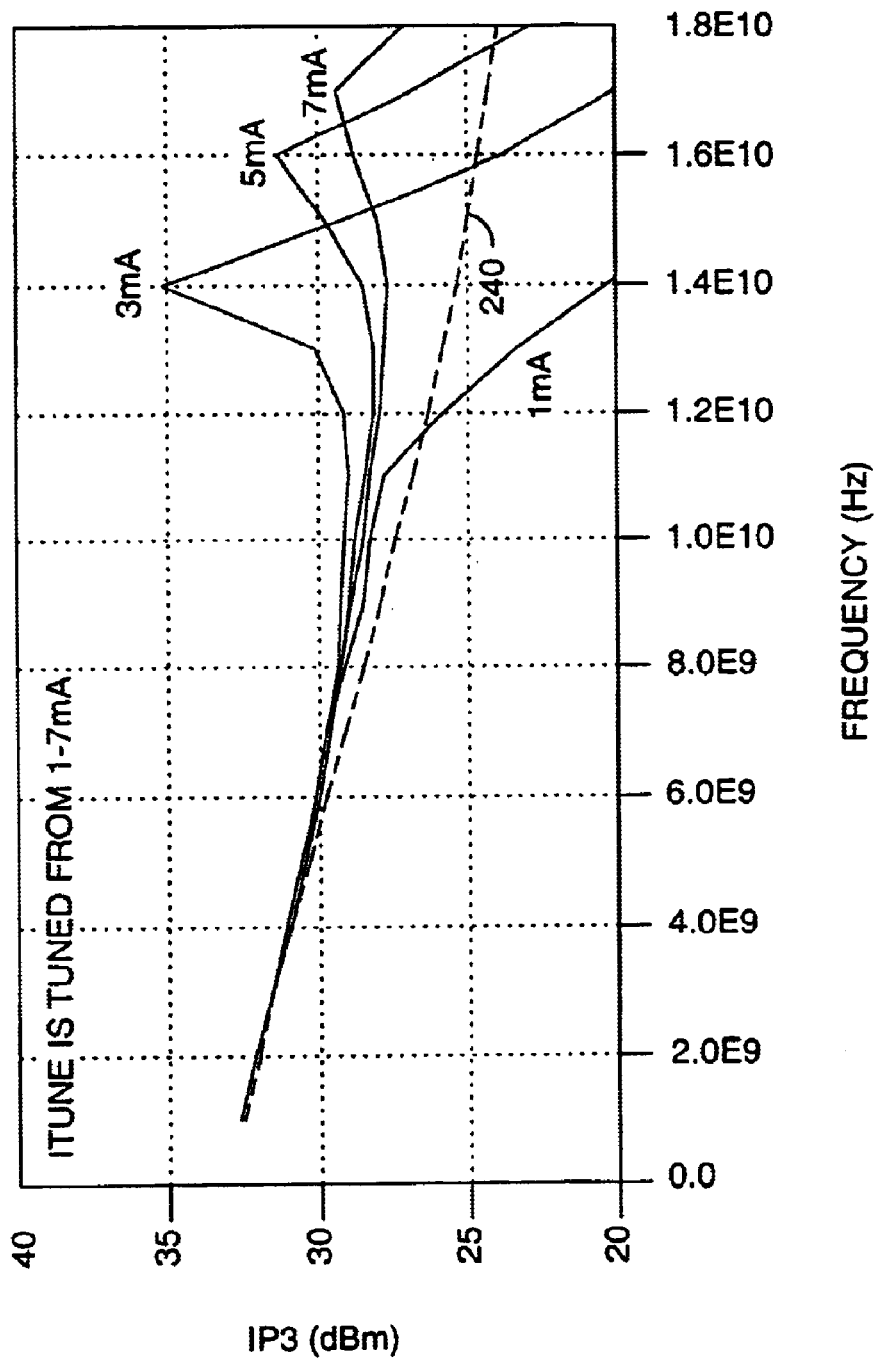
FIG. 12 is a diagram illustrating the electronically tuned IP3 response of one embodiment of the present invention compared with the response of a conventional implementation.

FIG. 12 illustrates linearizing the Darlington amplifier 100 by electronically adjusting the current ITUNE from 1–7 mA, the capacitance CTUNE=5 pF, the resistance RTUNE=15 ohms, and the inductance LTUNE=400 um. The IP3 as a result of electronically tuning the current ITUNE is shown. A trace 240 of the conventional Darlington amplifier 10 is shown for reference. Yet another aspect of the invention is that linearization can be electronically adjusted by tuning bias current ITUNE by employing a voltage controlled current source. An optimum bias current may occur where IP3 is maximum up to 15 GHz. Relative to the conventional case, the 2 mA optimum bias current obtains a 10 dB improvement in IP3 at 14 GHz, and generally allows broadband IP performance up to 15 Ghz.

The transistors described herein may be implemented as bipolar junction transistors (BJTs), heterojunction bipolar transistors (HBTs), double heterojunction bipolar transistors (DHBT) or pseudomorphic high electron mobility transistors (PHEMT). However, other transistors with similar characteristics may be implemented to meet the design criteria of a particular implementation. In particular, the various transistors of the present invention may be implemented using a variety of process technologies. For example, any or all semiconductors, including compound semiconductors, III–V semiconductors, Silicon Germanium (SiGe), Indium Gallium Phosphorous (InGaP), Indium Phosphide (InP), or Gallium Arsenide (GaAs) may be used. However, other process technologies may be implemented to meet the design criteria of a particular implementation.

It should be noted that the capability of this invention is not limited to that illustrated in this disclosure. The example simulations in this disclosure is for illustrative purposes and that other embodiments of the invention could achieve even greater improvement in linearity without departing from the general spirit of the invention.

While the invention has been particularly shown and described with reference to the preferred embodiments thereof, it will be understood by those skilled in the art that various changes in form and details may be made without departing from the spirit and scope of the invention.

What is claimed is:

1. An apparatus comprising:
    a Darlington transistor pair configured to generate an output signal in response to an input signal; and
    a common-base transistor (i) coupled between an output transistor of said Darlington transistor pair and said output signal and (ii) having a base configured to receive a frequency dependent reference voltage.

2. The apparatus of claim 1, wherein said frequency dependent reference voltage is configured to optimize performance of said apparatus.

3. The apparatus according to claim 1, wherein said frequency dependent reference voltage is generated by a reference circuit.

4. The apparatus according to claim 3, wherein said reference circuit includes an emitter follower and an inductive element.

5. The apparatus according to claim 4, wherein said reference circuit further includes a series RLC tank configured to optimize linearity, gain and stability performance.

6. The apparatus according to claim 3, wherein said reference circuit is electronically tunable to control linearity of said apparatus.

7. The apparatus according to claim 1, wherein said common-base transistor improves broadband linearity (IP3) of said apparatus.

8. The apparatus according to claim 1, wherein said common-base transistor is configured in cascode with said output transistor.

9. The apparatus according to claim 1, wherein said Darlington transistor pair further comprises an input transistor.

10. The apparatus according to claim 1, wherein said common-base transistor is configured to adjust the phase of said output signal.

11. The apparatus according to claim 3, wherein said reference circuit comprises a DC voltage reference configured to provide a DC bias to the base of said common-base transistor.

12. The apparatus according to claim 11, wherein said reference circuit is further configured to provide a frequency dependent AC impedance to the base of said common-base transistor.

13. An apparatus comprising:
    means for configuring a Darlington transistor pair to generate an output signal in response to an input signal; and means for configuring a common-base transistor (i) coupled between an output transistor of said Darlington transistor pair and said output signal and (ii) having a base configured to receive a frequency dependent linearity reference voltage.

14. A method for implementing a linearized Darlington amplifier comprising the steps of:
   (A) configuring a Darlington transistor pair to generate an output signal in response to an input signal; and
   (B) coupling a common-base transistor between an output transistor of said Darlington transistor pair and said output signal, wherein a base of said common-base transistor is configured to receive a frequency dependent reference voltage.

15. The method of claim 14, wherein said frequency dependent reference voltage is configured to optimize performance of said Darlington amplifier.

16. The method according to claim 14, further comprising the step of:
   generating said frequency dependent reference voltage with a reference circuit.

17. The method according to claim 14, wherein said frequency dependent reference voltage is electronically tunable to control linearity of said Darlington amplifier.

18. The method according to claim 14, wherein step (B) improves broadband linearity (IP3) of said Darlington amplifier.

19. The method according to claim 14, wherein said common-base transistor is configured to adjust the phase of said output signal.

20. The method according to claim 14, wherein step (B) is further configured to provide a frequency dependent AC impedance to the base of said common-base transistor.

* * * * *